United States Patent
Yoo et al.

(10) Patent No.: US 7,821,809 B2
(45) Date of Patent: Oct. 26, 2010

(54) NONVOLATILE MEMORY DEVICE AND METHOD INCLUDING RESISTOR AND TRANSISTOR

(75) Inventors: In-Kyeong Yoo, Suwon-si (KR); Myoung-Jae Lee, Suwon-si (KR); Sun-Ae Seo, Hwaseong-si (KR); David Seo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/267,825

(22) Filed: Nov. 7, 2005

(65) Prior Publication Data

US 2006/0113614 A1    Jun. 1, 2006

(30) Foreign Application Priority Data

Nov. 6, 2004    (KR) ................. 10-2004-0090124

(51) Int. Cl.
*G11C 11/00* (2006.01)

(52) U.S. Cl. ................. 365/148; 257/314; 257/379; 257/390; 257/410; 257/528; 257/E21.662; 257/E21.663; 257/E21.665; 257/E21.679; 257/E45.002; 365/185.08; 365/185.29; 438/381; 438/279; 438/283; 438/587

(58) Field of Classification Search ................. 257/379, 257/528, 2, E21.662, E21.663, E21.665, 257/E21.679, E45.002; 438/276–279; 365/148, 365/185.08, 185.29
See application file for complete search history.

(56) References Cited

U.S. PATENT DOCUMENTS

| | | | | |
|---|---|---|---|---|
| 5,406,509 A | * | 4/1995 | Ovshinsky et al. | 365/113 |
| 5,804,484 A | * | 9/1998 | Wen | 438/278 |
| 5,894,447 A | * | 4/1999 | Takashima | 365/158 |
| 6,673,648 B2 | * | 1/2004 | Lowrey | 438/102 |
| 6,815,744 B1 | | 11/2004 | Beck et al. | |
| 6,838,727 B2 | | 1/2005 | Yoo et al. | |
| 6,844,564 B2 | * | 1/2005 | Tanaka et al. | 257/3 |
| 7,071,485 B2 | * | 7/2006 | Takaura et al. | 257/3 |
| 2003/0227052 A1 | | 12/2003 | Ono et al. | |
| 2004/0051094 A1 | * | 3/2004 | Ooishi | 257/5 |
| 2004/0114438 A1 | * | 6/2004 | Morimoto | 365/185.29 |
| 2004/0121261 A1 | * | 6/2004 | Ashida et al. | 430/270.13 |
| 2004/0174732 A1 | * | 9/2004 | Morimoto | 365/148 |

(Continued)

FOREIGN PATENT DOCUMENTS

CN    1340213    3/2002

(Continued)

OTHER PUBLICATIONS

Chinese Office Action dated Apr. 18, 2008 with English translation of text.

(Continued)

*Primary Examiner*—Lynne A Gurley
*Assistant Examiner*—Meiya Li
(74) *Attorney, Agent, or Firm*—Harness, Dickey & Pierce, P.L.C.

(57) ABSTRACT

A nonvolatile memory device including one resistor and one transistor. The resistor may correspond to a resistance layer electrically connected to a first impurity region and a second impurity region of the transistor.

15 Claims, 5 Drawing Sheets

U.S. PATENT DOCUMENTS

| | | |
|---|---|---|
| 2004/0233748 A1* 11/2004 | Terao et al. | 365/202 |
| 2004/0234895 A1* 11/2004 | Lee et al. | 430/311 |
| 2004/0245557 A1* 12/2004 | Seo et al. | 257/298 |
| 2005/0117397 A1*  6/2005 | Morimoto | 365/185.21 |
| 2005/0263829 A1* 12/2005 | Song et al. | 257/379 |
| 2006/0109704 A1*  5/2006 | Seo et al. | 365/148 |

FOREIGN PATENT DOCUMENTS

| | | |
|---|---|---|
| CN | 1449058 | 10/2003 |
| CN | 1467847 | 1/2004 |
| CN | 1551240 | 12/2004 |
| JP | 2000-216271 | 8/2000 |
| WO | WO 2004/084306 | 9/2004 |

OTHER PUBLICATIONS

Chinese Office Action dated Oct. 24, 2008 with English translation.
Chinese Office Action dated Apr. 10, 2009 with English translation.
Chinese Office Action dated Feb. 5, 2010 with English translation for corresponding Chinese Application No. 200510120235.5.
Chinese Office Action dated Jul. 30, 2010 with English translation for corresponding Chinese Application No. 200510120235.5.

* cited by examiner

NONVOLATILE MEMORY DEVICE AND METHOD INCLUDING RESISTOR AND TRANSISTOR

PRIORITY STATEMENT

This application claims the benefit of Korean Patent Application No. 10-2004-0090124, filed on Nov. 6, 2004, in the Korean Intellectual Property Office, the disclosure of which is incorporated herein in its entirety by reference.

BACKGROUND OF THE INVENTION

1. Field of the Invention

Example embodiments of the present invention relate to a nonvolatile memory device having one resistor and one transistor.

2. Description of the Related Art

Semiconductor memory devices may have a high integration, that is, a large number of memory cells included per unit area, may operate at high speed, and may be driven at low power. Research into such semiconductor memory devices is ongoing and various types of memory devices are under development.

Generally, a semiconductor memory device may include many memory cells connected together. In a dynamic random access memory (DRAM), which is a representative semiconductor memory device, a memory cell may generally be comprised of a switch and a capacitor. DRAMs have several advantages, including high integration and fast operation. However, after being turned off, data stored in DRAMs is lost.

A representative nonvolatile memory device that can conserve stored data even after being turned off is flash memory. Flash memory has a nonvolatile property, in contrast with volatile memory, but may have lower integration and/or may operate slower compared with DRAMs.

Examples of nonvolatile memory devices that are under development include magnetic random access memory (MRAM), ferroelectric random access memory (FRAM), and phase-change random access memory (PRAM).

MRAM stores data using a change in a direction of magnetization occurring in a tunnel junction. FRAM stores data using the polarization of a ferroelectric material. Each has advantages. As described above, memory devices are being developed to increase integration, data retention, and/or operating speed, and be driven with lower power.

PRAM stores data using a change in a resistance value according to a phase variation of a material and may be comprised of a resistor and a switch (transistor). The resistor used in PRAM may be a chalcogenide resistance material, which becomes crystalline or amorphous by controlling a memory device formation temperature. That is, a memory device may be formed based on the principle that resistance of an amorphous resistance material is higher than that of a crystalline resistance material. As described above, when a conventional DRAM manufacturing process is used in the manufacture of a PRAM, etching may be more difficult, and even if etching is performed, the etching process may take more time. A lower etching time reduces productivity and/or increases the unit cost of a product.

SUMMARY OF THE INVENTION

Example embodiments of the present invention provide a nonvolatile memory device having a resistor and a transistor, the nonvolatile memory device capable of being more simply manufactured, driven with lower power, and/or operated at higher speed.

According to an example embodiment of the present invention, there is provided a nonvolatile memory device including a transistor and a resistance layer electrically connected to a first impurity region and a second impurity region of the transistor.

In an example embodiment, the transistor may include a substrate, the first and second impurity regions formed a distance apart from each other in the substrate, a gate insulative layer formed on the substrate and in contact with the first and second impurity regions, and a gate electrode layer formed on the gate insulative layer.

In an example embodiment, the gate insulative layer and the gate electrode layer may be coated with an interlayer insulative layer, and the first and second impurity regions may be electrically connected to the resistance layer via contact plugs that penetrate the interlayer insulative layer.

In an example embodiment, the resistance layer may be an oxide layer that represents a resistance variation.

In an example embodiment, the oxide layer may include at least one material of nickel oxide (NiO), titanium oxide ($TiO_2$), hafnium oxide (HfO), niobium oxide ($Nb_2O_5$), zinc oxide (ZnO), zirconium oxide ($ZrO_2$), tungsten oxide ($WO_3$), cobalt oxide (CoO), and PCMO ($Pr_xCa_{1-x}MnO_3$).

In an example embodiment, the resistance layer may be formed of a material including GST (Ge2Sb2Te5).

According to another example embodiment of the present invention, there is provided a nonvolatile memory device array including an array of a plurality of transistors and a resistance layer that is electrically connected to a first impurity region and a second impurity region in each of the transistors. A first group of transistors in a first direction may share an impurity region and a second group of transistors in a second direction, for example, perpendicular to the first direction, may share a gate electrode layer.

According to another example embodiment of the present invention, there is provided a method of operating a nonvolatile memory device array, the nonvolatile memory device array including an array of a plurality of transistors, a first group of transistors in a first direction sharing an impurity region and a second group of transistors in a second direction, for example, perpendicular to the first direction, sharing a gate electrode layer, and a resistance layer electrically connected to a first impurity region and a second impurity region in each of the transistors. The method may include selecting a unit cell to be operated, applying a gate voltage Vg through gate electrodes of unit cells other than the selected unit cell, and applying an operating voltage through impurity regions of the selected unit cell.

In an example embodiment, the gate voltage Vg may be greater than threshold voltages of the transistors.

According to another example embodiment of the present invention, there is provided a method of forming a nonvolatile memory device including forming first and second impurity regions in a substrate, forming a gate insulative layer on the substrate, forming a gate electrode layer on the gate insulative layer to form a gate structure, removing portions of the gate insulative layer and the gate electrode layer to expose the first and second impurity regions, forming an interlayer insulative layer on the gate structure and the first and second impurity regions, forming holes in the interlayer insulative layer to access the first and second impurity regions, filling the holes with contact plugs, and forming a resistive layer on the gate structure and a portion of each contact plug.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS OF THE INVENTION

Figure 1:
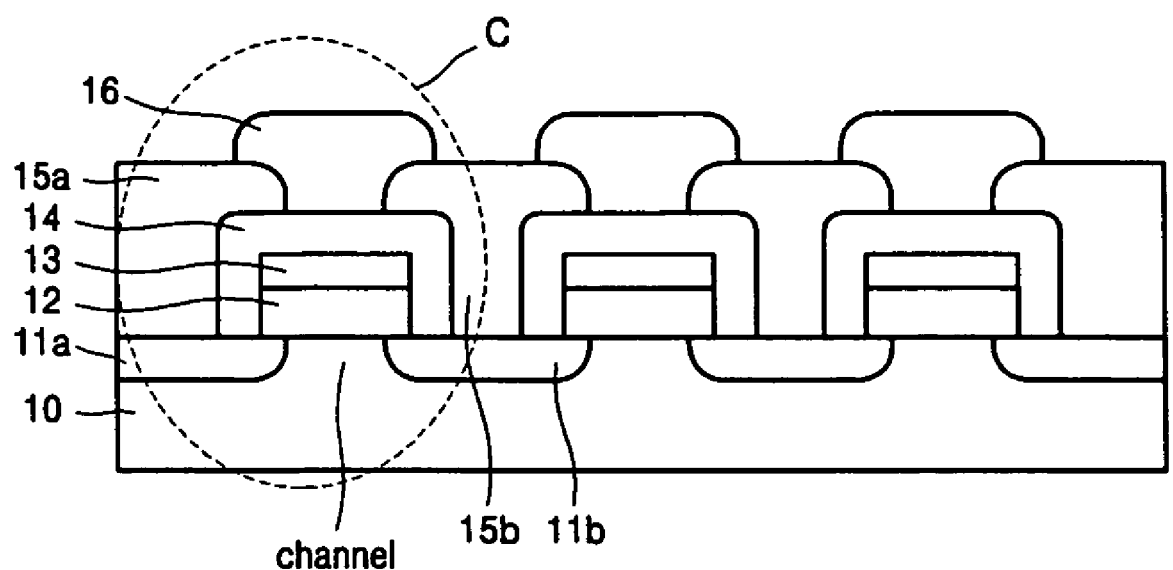
FIG. 1 is a cross-sectional view of a nonvolatile memory device having a single resistor and a single transistor, according to an example embodiment of the present invention.

Example embodiments of the present invention will now be described in detail with reference to the accompanying drawings.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a cross-sectional view of a nonvolatile memory device having a resistor and a transistor, according to an example embodiment of the present invention. Referring to FIG. 1, the nonvolatile memory device may include a transistor structure and a resistor formed on a substrate 10. A first impurity region 11a, which may be a source region, and a second impurity region 11b, which may be a drain region, may be formed on the substrate 10. A gate insulative layer 12 and/or a gate electrode layer 13, which may constitute a gate structure, may be sequentially stacked on the substrate 10 having the first and second impurity regions 11a and 11b. This resultant structure is a basic transistor.

An interlayer insulative layer 14 may be formed on the first and second impurity regions 11a and 11b and the gate structure. Holes may be formed in the interlayer insulative layer 14 to expose the first and second impurity regions 11a and 11b. Contact plugs 15a and 15b may be connected to the first and second impurity regions 11a and 11b, respectively, and a resistance layer 16 may be formed on the interlayer insulative layer 14.

In an example embodiment, the resistance layer 16 may include a chalcogenide.

For example, the resistance layer 16 may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the resistance layer 16 may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the resistance layer 16 may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the resistance layer 16 is described above as being formed primarily of ternary phase-change chalcogenide alloys, the chalcogenide alloy of the resistance layer 16 could be selected from a binary phase-change chalcogenide alloy or a quaternary phase-change chalcogenide alloy. Example binary phase-change chalcogenide alloys may include one or more of Ga—Sb—Se, In—Sb—Se, In—Se, Sb2-Te3 or Ge—Te alloys; example quaternary phase-change chalcogenide alloys may include one or more of an Ag—In—Sb—Te, (Ge—Sn)—Sb—Te, Ge—Sb—(Se—Te) or Te81-Ge15-Sb2-S2 alloy, for example.

In an example embodiment, the resistance layer 16 may be formed of GST (Ge2Sb2Te5) or a transition metal oxide that includes at least one material of nickel oxide (NiO), titanium oxide (TiO2), hafnium oxide (HfO), niobium oxide (Nb2O5), zinc oxide (ZnO), zirconium oxide (ZrO2), tungsten oxide (WO3), cobalt oxide (CoO), and PCMO (PrxCa1-xMnO3).

A method of manufacturing the nonvolatile memory device of FIG. 1, for example, a unit cell C shown in FIG. 1, will now be described with reference to FIGS. 2A through 2F.

Figure 2A:
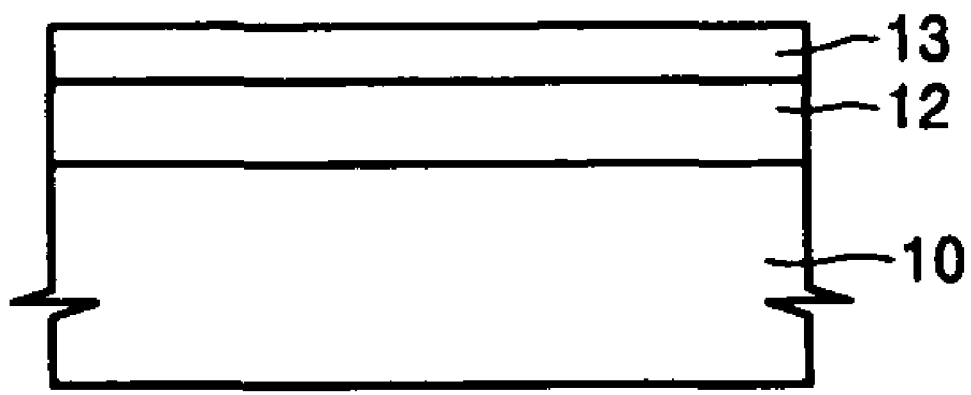
FIGS. 2A through 2F are cross-sectional views illustrating a method of manufacturing the nonvolatile memory device of FIG. 1.
Figure 2B:
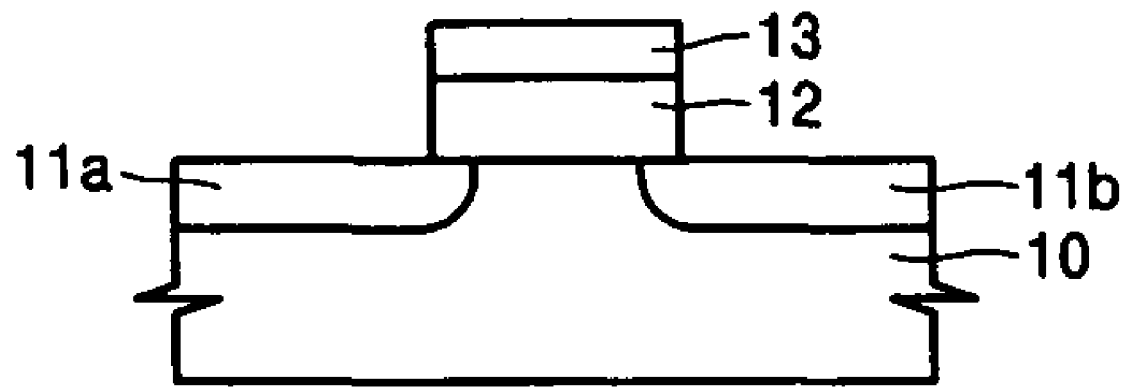

As shown in FIG. 2A, the semiconductor substrate 10 may be prepared, and the gate insulative layer 12 and the gate electrode layer 13 may be sequentially formed on the semiconductor substrate 10. As shown in FIG. 2B, side portions of the gate insulative layer 12 and the gate electrode layer 13 may be etched away to expose the substrate 10. An exposed area of the substrate 10 may be doped with impurities to form the first and second impurity regions 11a and 11b. As a result, a basic transistor is formed.

Figure 2C:
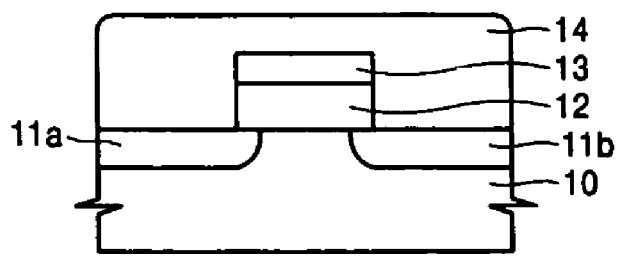
Figure 2D:
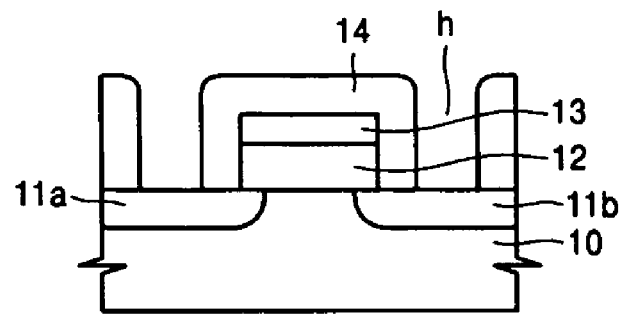
Figure 2E:
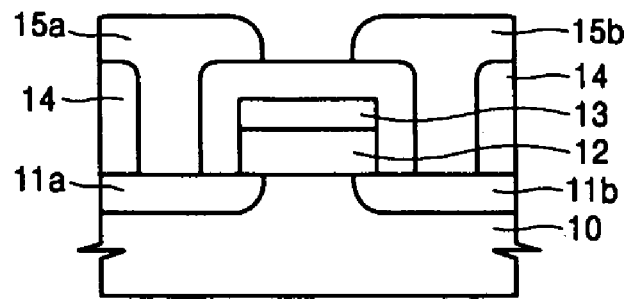

As shown in FIG. 2C, the transistor may be coated with the interlayer insulative layer 14. As shown in FIG. 2D, holes h may be formed in the interlayer insulative layer 14 to expose the first and second impurity regions 11a and 11b. As shown in FIG. 2E, the holes h may be coated with a conductive material to thereby form contact plugs 15a and 15b. As shown in FIG. 2G, the contact plugs 15a and 15b are formed not to contact each other.

Figure 2F:
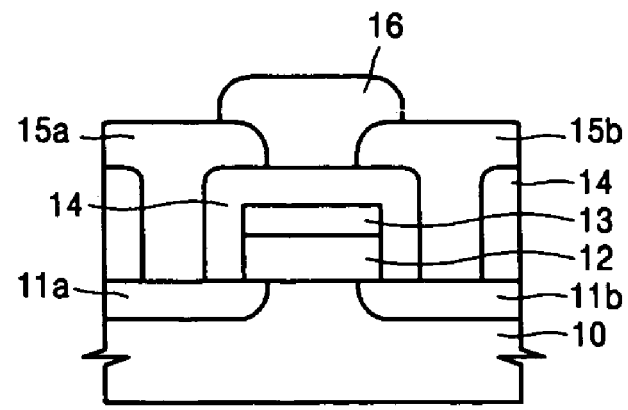

As shown in FIG. 2F, the resistance layer 16 may be formed on the interlayer insulative layer 14 to contact the first and second contact plugs 15a and 15b. As described above, the resistance layer 16 may be usually formed of transfer metal oxide that includes at least one material of nickel oxide (NiO), titanium oxide ($TiO_2$), hafnium oxide (HfO), niobium oxide ($Nb_2O_5$), zinc oxide (ZnO), zirconium oxide ($ZrO_2$), tungsten oxide ($WO_3$), cobalt oxide (CoO), GST ($Ge_2Sb_2Te_5$), and PCMO ($Pr_xCa_{1-x}MnO_3$). The above-described manufacturing method can be accomplished using a conventional DRAM manufacturing process.

Figure 3:
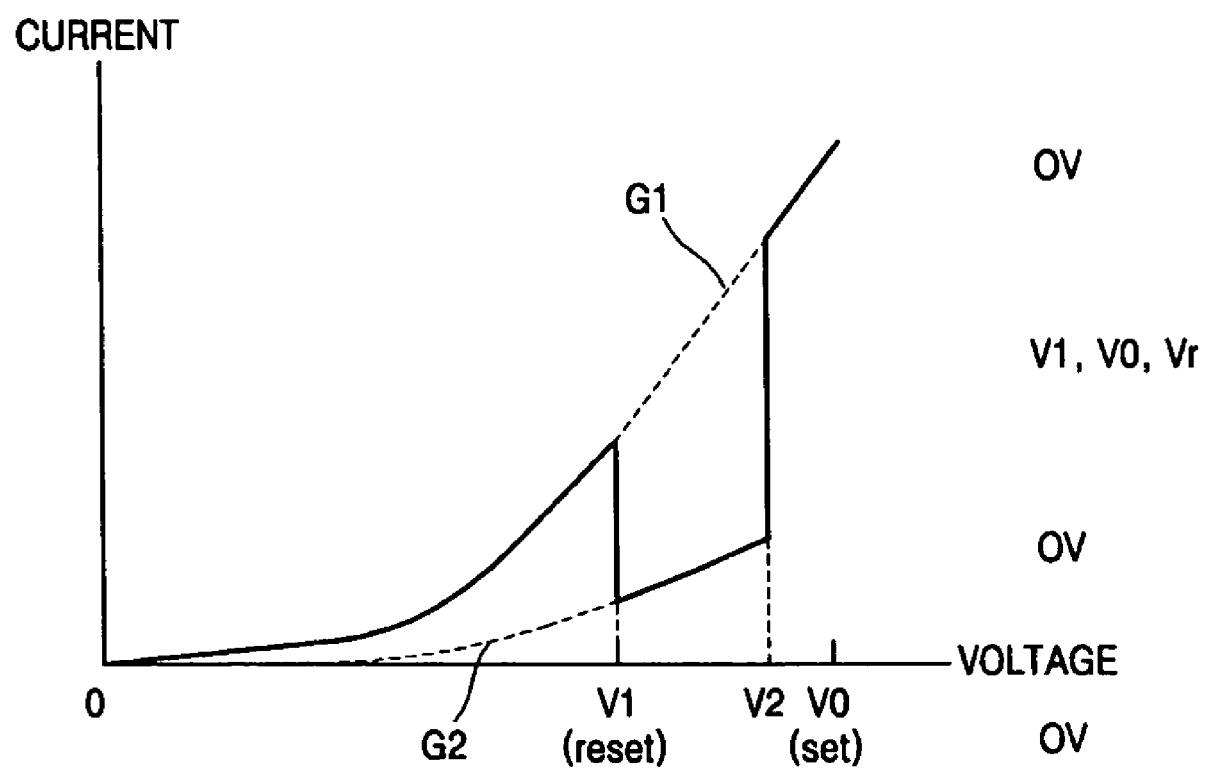
FIG. 3 is a graph illustrating operating characteristics of the nonvolatile memory device of FIG. 1.

Electrical characteristics of the nonvolatile memory device of FIG. 1 will now be described in greater detail with reference to FIG. 3. In FIG. 3, the horizontal axis indicates a voltage applied to the resistance layer 16 and the vertical axis indicates current that flows in the resistance layer 16.

Referring to FIG. 3, the voltage applied to the resistance layer 16 and the current depending on the applied voltage may vary according to two current-voltage curves. G1 denotes a current-voltage curve when the resistance of the resistance layer 16 becomes low, that is, when the current flowing in the resistance layer 16 is large. G2 denotes a current-voltage curve when the resistance of the resistance layer 16 becomes high, that is, when the current flowing in the resistance layer 16 is small. The current-voltage curves G1 and G2 may be formed under identical voltage condition(s).

The nonvolatile memory device having a resistor and a transistor of FIG. 1 may be manufactured based on the electrical characteristic of the resistance layer 16 in that the resistance layer 16 provides different current-resistance characteristics. This electrical characteristic will now be described in detail.

When the applied voltage gradually increases from 0V to V1, current increases along the curve G1 in proportion to the magnitude of voltage. However, when a voltage of V1 is applied, the current drops and then increases along the curve G2. The increase of the current along the curve G2 continues until a voltage of V2 is applied. When a voltage greater than V2 is applied, the current rises and then increases along the curve G1. A resistance depending upon the characteristics of the curve G1 is referred to as a first resistance, and a resistance depending upon the characteristics of the curve G2 is referred to as a second resistance. In other words, the resistance of the resistance layer 16 when the applied voltage is between V1 and V2, that is, the second resistance, increases.

Nonvolatile memory device having one resistance material and one transistor according to example embodiments of the present invention may have the following characteristics. When a voltage smaller than V1 was applied after a voltage V (V1≦V≦V2) was applied, a current on the curve G2 was detected. When a voltage smaller than V1 was applied after a voltage greater than V2 was applied, a current on the curve G1 was detected. Accordingly, the nonvolatile memory device having these characteristics can be used as a memory device.

As a result, when a voltage greater than V2 is applied to the resistance layer 16 of the nonvolatile memory device according to an example embodiment of the present invention, the resistance layer 16 stores the first resistance value. When the voltage V (V1≦V≦V2) is applied to the resistance layer 16, the resistance layer 16 stores the second resistance value. A memory state stored in the resistance layer 16 can be recognized by reading a current that flows when a voltage Vr smaller than V1 is applied.

Figure 4:
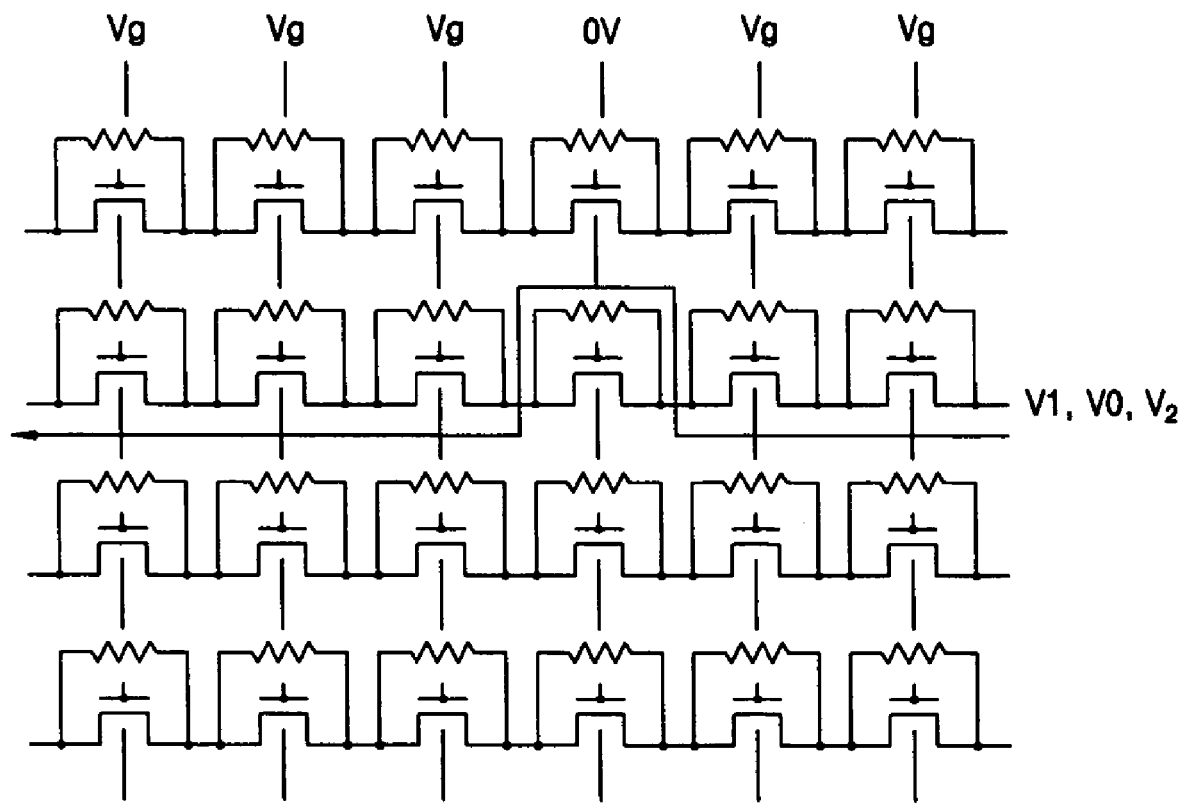
FIG. 4 is an equivalent circuit diagram of a nonvolatile memory device array comprising a plurality of nonvolatile memory devices of FIG. 1.

FIG. 4 is an equivalent circuit diagram of a nonvolatile memory device array including a plurality of nonvolatile memory devices of FIG. 1. Referring to FIG. 4, unit cells arrayed in a first direction, that is, a horizontal direction, may be connected together by sharing the first or second impurity region 11a or 11b of FIG. 1, and unit cells arrayed in a second direction, that is, a vertical direction, may be connected together by sharing the gate electrode layer 13 of FIG. 1. Hence, the unit cell array of the nonvolatile memory device of FIG. 1 may be considered a NAND-type array.

To write data to or erase data from a specific cell or read data from the specific cell, a voltage of V1, V0, or V2 as shown in FIG. 3 is received through impurity regions in the horizontal direction connected to the specific cell, and a gate voltage provided in the vertical direction is 0V, that is, no voltage is applied. When gate electrode layers of the cells other than the specific cell receive a gate voltage Vg, which is equal to or greater than a threshold voltage Vth and keep their corresponding transistors in an on state, current flows in impurity regions and channel regions. However, the specific cell receives a gate voltage of 0V, and thus, no electric potential is received through a channel. Instead, a voltage is applied to both ends of a resistance layer through contact plugs, so that data can be processed as desired. This operation will be described in greater detail with reference to FIG. 5.

Figure 5:
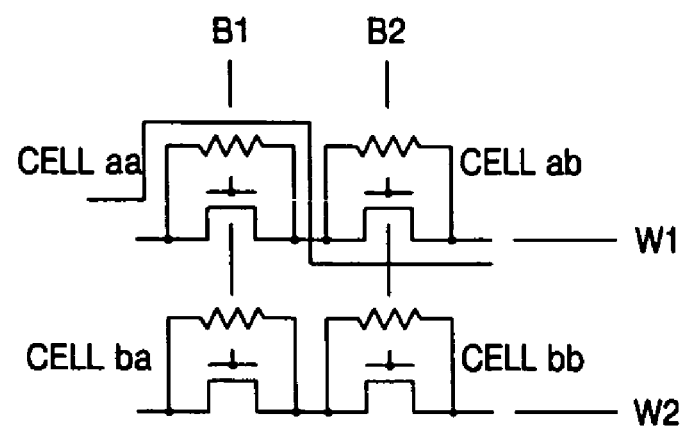
FIG. 5 is a circuit diagram illustrating an operating principle of the nonvolatile memory device of FIG. 1.

FIG. 5 is an equivalent circuit diagram illustrating four (4) unit cells extracted from the unit cells shown in FIG. 4. Referring to FIG. 5, four memory cells aa, ab, ba, and bb are shown, memory cells aa and ba in the vertical direction share a gate line B1, memory cells ab and bb in the vertical direction share a gate line B2, the memory cells aa and ab in the horizontal direction share an impurity region W1, and the memory cells ba and bb in the horizontal direction share an impurity region W2.

Storage of the first resistance value depending upon the curve G1 of FIG. 3 in the resistance layer 16 may be referred to as programming (set). Storage of the second resistance value depending upon the curve G2 of FIG. 3 instead of the first resistance value in the resistance layer 16 may be referred to as erasure (reset).

A cell to be operated in FIG. 5 may first be selected. When the selected cell is the memory cell aa, a voltage greater than V2 must be applied to store the first resistance value in the memory cell aa. To do this, a voltage V0 (V0>V2) is applied through the impurity region W1, and a gate voltage Vg is applied to the gate electrode line B2. At this time, no voltages are applied to the impurity region W2 and the gate electrode line B1. When the gate voltage Vg, that is, a voltage greater than the threshold voltage Vth, is applied to the gate electrode line B2, the cells ab and bb are turned on, and thus, current flows in the cells ab and bb through their channel regions. When the voltage of V0 is applied through the impurity region W1, an electric potential is applied to the memory cells aa and ab.

Because the channel region of the cell ab is activated due to the gate voltage Vg received through the gate electrode line B2, current can be supplied through a channel region, which has lower resistance. However, because the channel region of the cell aa is not activated, the voltage of V0 is applied to both ends of the resistance layer 16 through the contact plugs 15a and 15b. Hence, the cell aa has the first resistance value, and thus programming can be achieved. In the same principle, a voltage of V (V1≦V≦V2) may be applied through the impurity region W1 to make the memory cell aa have the second resistance. To read out data stored in the resistance layer 16 of the memory cell aa, a voltage of V (V<V1) may be applied through the impurity region W1, and the voltage Vg is applied to the gate electrode line B2. Through these processes, data programming, data erasure, and data readout can be achieved.

A nonvolatile memory device according to example embodiments of the present invention may have one or more of the following advantages.

A unit cell of a non-volatile memory device may have a simple structure formed by consecutively stacking one transistor and one resistor. Even when a plurality of such unit cells are arrayed, only one bit line and one word line are needed. Thus, a nonvolatile memory device array may also be simpler.

A nonvolatile memory device according to an example embodiment of the present invention may be manufactured using known semiconductor manufacturing processes, for example, a conventional DRAM manufacturing process. Therefore, the productivity of the nonvolatile memory device may increase, leading to a reduction of the manufacturing costs.

Data can be simply stored in and reproduced from the nonvolatile memory device according to example embodiments of the present invention by operating the nonvolatile memory device based on a resistance characteristic of a material. Thus, the nonvolatile memory devices according to example embodiments of the present invention operate at higher speed.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A nonvolatile memory device comprising:
   a unit cell including,
      a single transistor including a substrate, a first impurity region and a second impurity region spaced apart from each other in the substrate, a gate insulative layer formed on the substrate between the first impurity region and the second impurity region, and a gate electrode layer formed on the gate insulative layer,
      an interlayer insulative layer coating the gate insulative layer and the gate electrode layer,
      a first contact plug formed in the interlayer insulative layer,
      a second contact plug formed in the interlayer insulative layer, and
      a resistance layer overlapping the first contact plug and the second contact plug and electrically connecting the first impurity region and the second impurity region through the first contact plug and the second contact plug.

2. The nonvolatile memory device of claim 1, wherein the resistance layer is an oxide layer that exhibits a resistance variation.

3. The nonvolatile memory device of claim 2, wherein the oxide layer includes at least one material of nickel oxide (NiO), titanium oxide ($TiO_2$), hafnium oxide (HfO), niobium oxide ($Nb_2O_5$), zinc oxide (ZnO), zirconium oxide ($ZrO_2$), tungsten oxide ($WO_3$), cobalt oxide (CoO), and PCMO ($Pr_xCa_{1-x}MnO_3$).

4. The nonvolatile memory device of claim 1, wherein resistance layer is formed of a chalcogenide material.

5. The nonvolatile memory device of claim 4, wherein the chalcogenide material includes GST ($Ge_2Sb_2Te_5$).

6. A nonvolatile memory device array comprising:
   an array of unit cells;
   a first group of the array of unit cells in a first direction sharing an impurity region, and
   a second group of the array of unit cells in a second direction, perpendicular to the first direction, sharing a gate electrode layer, each unit cell of the array of unit cells including a single transistor including a substrate, a first impurity region and a second impurity region spaced apart from each other in the substrate, a gate insulative layer formed on the substrate and in contact with the first impurity region and the second impurity region, the gate electrode layer being formed on the gate insulative layer, an interlayer insulating layer coating the gate insulative layer and the gate electrode layer, a first contact plug formed in the interlayer insulative layer, a second contact plug formed in the interlayer insulative layer, a resistance layer overlapping the first contact plug and the second contact plug and electrically connecting the first impurity region and the second impurity region through the first contact plug and the second contact plug.

7. The nonvolatile memory device array of claim 6, wherein the resistance layer is an oxide layer that exhibits a resistance variation.

8. The nonvolatile memory device array of claim 7, wherein the oxide layer includes at least one material of nickel oxide (NiO), titanium oxide ($TiO_2$), hafnium oxide (HfO), niobium oxide ($Nb_2O_5$), zinc oxide (ZnO), zirconium oxide ($ZrO_2$), tungsten oxide ($WO_3$), cobalt oxide (CoO), and PCMO ($Pr_xCa_{1-x}MnO_3$).

9. The nonvolatile memory device array of claim 6, wherein the resistance layer is formed of a chalcogenide material.

10. The nonvolatile memory device array of claim 9, wherein the chalcogenide material includes GST ($Ge_2Sb_2Te_5$).

11. A method of operating a nonvolatile memory device array including an array of unit cells, a first group of the array of unit cells in a first direction sharing an impurity region and a second group of the array of unit cells in a second direction, perpendicular to the first direction, sharing a gate electrode layer, each unit cell of the array of unit cells including a single transistor including a substrate, a first impurity region and a second impurity region spaced apart from each other in the substrate, a gate insulative layer formed on the substrate and in contact with the first impurity region and the second impurity region, a gate electrode layer formed on the gate insulative layer, an interlayer insulating layer coating the gate insulative layer and the gate electrode layer, a first contact plug formed in the interlayer insulative layer, a second contact plug formed in the interlayer insulative layer, a resistance layer overlapping the first contact plug and the second contact plug and electrically connecting the first impurity region and the second impurity region through the first contact plug and the second contact plug, the method comprising:

selecting a unit cell corresponding to one of the array of transistors to be operated;

applying a gate voltage Vg through gate electrodes of unit cells corresponding to others of the array of transistors, other than the selected unit cell; and applying an operating voltage through impurity regions of the selected unit cell.

12. The method of claim 11, wherein the gate voltage Vg is greater than threshold voltages of the transistors.

13. A nonvolatile memory device array comprising:

a plurality of nonvolatile memory devices of, each of the nonvolatile memory devices including a unit cell including, a single transistor including a substrate, a first impurity region and a second impurity region spaced apart from each other in the substrate, a gate insulative layer formed on the substrate between the first impurity region and the second impurity region, and a gate electrode layer formed on the gate insulative layer, an interlayer insulative layer coating the gate insulative layer and the gate electrode layer, a first contact plug formed in the interlayer insulative layer, a second contact plug formed in the interlayer insulative layer, and a resistance layer overlapping the first contact plug and the second contact plug and electrically connecting the first impurity region and the second impurity region through the first contact plug and the second contact plug.

14. A nonvolatile memory device array comprising:
an array of unit cells, a first group of the array of unit cells in a first direction sharing an impurity region, and a second group of the array of unit cells in a second direction, perpendicular to the first direction, sharing a gate electrode layer, each unit cell of the array of unit cells including a single transistor including a substrate, a first impurity region and a second impurity region spaced apart from each other in the substrate, a gate insulative layer formed on the substrate and in contact with the first impurity region and the second impurity region, the gate electrode layer being formed on the gate insulative layer, an interlayer insulating layer coating the gate insulative layer and the gate electrode layer, a first contact plug formed in the interlayer insulative layer, a second contact plug formed in the interlayer insulative layer, a resistance layer overlapping the first contact plug and the second contact plug and electrically connecting the first impurity region and the second impurity region through the first contact plug and the second contact plug.

15. A method of operating a nonvolatile memory device array including an array of unit cells, a first group of the array of unit cells in a first direction sharing an impurity region and a second group of the array of unit cells in a second direction, perpendicular to the first direction, sharing a gate electrode layer, each unit cell of the array of unit cells including a single transistor including a substrate, a first impurity region and a second impurity region spaced apart from each other in the substrate, a gate insulative layer formed on the substrate and in contact with the first impurity region and the second impurity region, a gate electrode layer formed on the gate insulative layer, an interlayer insulating layer coating the gate insulative layer and the gate electrode layer, a first contact plug formed in the interlayer insulative layer, a second contact plug formed in the interlayer insulative layer, a resistance layer overlapping the first contact plug and the second contact plug and electrically connecting the first impurity region and the second impurity region through the first contact plug and the second contact plug, the method comprising:

selecting a unit cell corresponding to one of the first and second groups of unit cells to be operated;

applying a gate voltage Vg through gate electrodes of the rest unit cells of the one of the first and second group of unit cells, other than the selected unit cell; and applying an operating voltage through impurity regions of the selected unit cell.

* * * * *